United States Patent
Hao et al.

(10) Patent No.: US 10,741,425 B2
(45) Date of Patent: Aug. 11, 2020

(54) HELIUM PLUG DESIGN TO REDUCE ARCING

(71) Applicant: Lam Research Corporation, Fremont, CA (US)

(72) Inventors: Fangli Hao, Cupertino, CA (US); Yuehong Fu, Fremont, CA (US); Zhigang Chen, Campbell, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 526 days.

(21) Appl. No.: 15/439,109

(22) Filed: Feb. 22, 2017

(65) Prior Publication Data

US 2018/0240688 A1  Aug. 23, 2018

(51) Int. Cl.
| | |
|---|---|
| *H01L 21/683* | (2006.01) |
| *H01T 23/00* | (2006.01) |
| *H01L 21/67* | (2006.01) |
| *H01J 37/32* | (2006.01) |

(52) U.S. Cl.
CPC .. *H01L 21/67103* (2013.01); *H01J 37/32477* (2013.01); *H01J 37/32623* (2013.01); *H01J 37/32715* (2013.01); *H01L 21/67109* (2013.01); *H01L 21/67248* (2013.01)

(58) Field of Classification Search
CPC .......... H01L 21/67103; H01L 21/6833; H05K 7/20009; H02N 13/00
USPC ....................................................... 361/234
See application file for complete search history.

(56) References Cited

U.S. PATENT DOCUMENTS

| | | | |
|---|---|---|---|
| 4,416,561 | A | 11/1983 | Fischer |
| 6,395,363 | B1 | 5/2002 | Ballance et al. |
| 2010/0003824 | A1 | 1/2010 | Kadkhodayan et al. |
| 2010/0109263 | A1 | 5/2010 | Jun et al. |
| 2010/0244350 | A1 | 9/2010 | Fujisato et al. |

(Continued)

FOREIGN PATENT DOCUMENTS

| | | |
|---|---|---|
| JP | 2009182092 A | 8/2009 |
| JP | 2016-012733 A | 1/2016 |

(Continued)

OTHER PUBLICATIONS

Notification of Transmittal of International Search Report and the Written Opinion of the International Searching Authority dated Jun. 20, 2018 corresponding to International Application No. PCT/US2018/021333, 13 pages.

(Continued)

*Primary Examiner* — Thienvu V Tran
*Assistant Examiner* — Lucy M Thomas

(57) ABSTRACT

A substrate support includes a baseplate, a ceramic layer arranged on the baseplate, a bond layer arranged in a first gap between the baseplate and the ceramic layer, a channel formed through the baseplate, the bond layer, and the ceramic layer, and a plug arranged in the channel. The plug includes a lower portion arranged in the baseplate and an upper portion arranged in the ceramic layer. The lower portion includes a pocket and sidewalls surrounding the pocket. The upper portion extends below the ceramic layer and the first gap into the pocket, the sidewalls of the lower portion overlap the upper portion, and a second gap between the upper portion and the lower portion is located within the pocket of the lower portion below the first gap.

16 Claims, 4 Drawing Sheets

(56) References Cited

U.S. PATENT DOCUMENTS

| | | | |
|---|---|---|---|
| 2011/0157760 A1 | 6/2011 | Willwerth et al. | |
| 2013/0264015 A1 | 10/2013 | Fang et al. | |
| 2014/0376148 A1* | 12/2014 | Sasaki | H01L 21/67109 361/234 |
| 2016/0013026 A1 | 1/2016 | Matsuura et al. | |
| 2016/0135252 A1 | 5/2016 | Matyushkin et al. | |
| 2016/0276198 A1* | 9/2016 | Anada | H01L 21/67109 |

FOREIGN PATENT DOCUMENTS

| | | |
|---|---|---|
| KR | 10-0505035 B1 | 7/2005 |
| KR | 10-1413764 B1 | 7/2014 |
| WO | 2013039718 A1 | 3/2013 |
| WO | 2015009447 A1 | 1/2015 |

OTHER PUBLICATIONS

Notification of Transmittal of International Search Report and the Written Opinion of the International Searching Authority dated Feb. 14, 2018, 15 pages.

Notification of Transmittal of International Search Report and the Written Opinion of the International Searching Authority corresponding to International Application No. PCT/US2018/018916 dated May 23, 2018, 12 pages.

* cited by examiner

HELIUM PLUG DESIGN TO REDUCE ARCING

CROSS-REFERENCE TO RELATED APPLICATIONS

The present disclosure is related by subject matter to U.S. patent application Ser. No. 15/399,244, filed on Jan. 5, 2017 and U.S. patent application Ser. No. 15/452,976, filed on Mar. 8, 2017. The entire disclosures of the applications referenced above are incorporated herein by reference.

FIELD

The present disclosure relates to a ceramic layer of a substrate support in a substrate processing system.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to treat substrates such as semiconductor wafers. Example processes that may be performed on a substrate include, but are not limited to, chemical vapor deposition (CVD), atomic layer deposition (ALD), conductor etch, dielectric etch, and/or other etch, deposition, or cleaning processes. A substrate may be arranged on a substrate support, such as a pedestal, an electrostatic chuck (ESC), etc. in a processing chamber of the substrate processing system. During etching, gas mixtures including one or more precursors may be introduced into the processing chamber and plasma may be used to initiate chemical reactions.

The substrate support may include a ceramic layer arranged to support a substrate. For example, the substrate may be clamped to the ceramic layer during processing. The substrate support may include a plurality of channels to provide a heat transfer gas (e.g., helium) to a backside of the substrate arranged on the ceramic layer. The heat transfer gas facilitates cooling of the substrate and/or the ceramic layer.

SUMMARY

A substrate support includes a baseplate, a ceramic layer arranged on the baseplate, a bond layer arranged in a first gap between the baseplate and the ceramic layer, a channel formed through the baseplate, the bond layer, and the ceramic layer, and a plug arranged in the channel. The plug includes a lower portion arranged in the baseplate and an upper portion arranged in the ceramic layer. The lower portion includes a pocket and sidewalls surrounding the pocket. The upper portion extends below the ceramic layer and the first gap into the pocket, the sidewalls of the lower portion overlap the upper portion, and a second gap between the upper portion and the lower portion is located within the pocket of the lower portion below the first gap.

A substrate processing system includes a substrate support, a heat transfer gas source, and a controller. The substrate support includes a baseplate, a ceramic layer arranged on the baseplate, a bond layer arranged in a first gap between the baseplate and the ceramic layer, a plurality of channels, formed through the baseplate, the bond layer, and the ceramic layer, in fluid communication with the heat transfer gas source, and a plurality of plugs arranged in respective ones of the plurality of channels. Each of the plurality of plugs includes a lower portion arranged in the baseplate and an upper portion arranged in the ceramic layer. The lower portion includes a pocket and sidewalls surrounding the pocket. The upper portion extends below the ceramic layer and the first gap into the pocket, the sidewalls of the lower portion overlap the upper portion, and a second gap between the upper portion and the lower portion is located within the pocket of the lower portion below the first gap. The controller selectively controls the heat transfer gas source to provide a heat transfer gas to a backside of a substrate arranged on the ceramic layer via the plurality of channels.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

A substrate support in a substrate processing system may include a plurality of channels to provide a heat transfer gas to a backside of a substrate, or wafer, arranged on the substrate support. For example, the channels provide the heat transfer gas from a heat transfer gas source through a baseplate and a ceramic layer of the substrate support. Manufacturing tolerances and other manufacturing limitations associated with components of the substrate support may cause the channels to have a greater diameter and volume at an interface between the baseplate and the ceramic layer. Accordingly, plasma light-up and arcing may be more likely to occur in gaps between the baseplate and the ceramic layer, causing current spikes and erosion of a bond layer.

Figure 1:
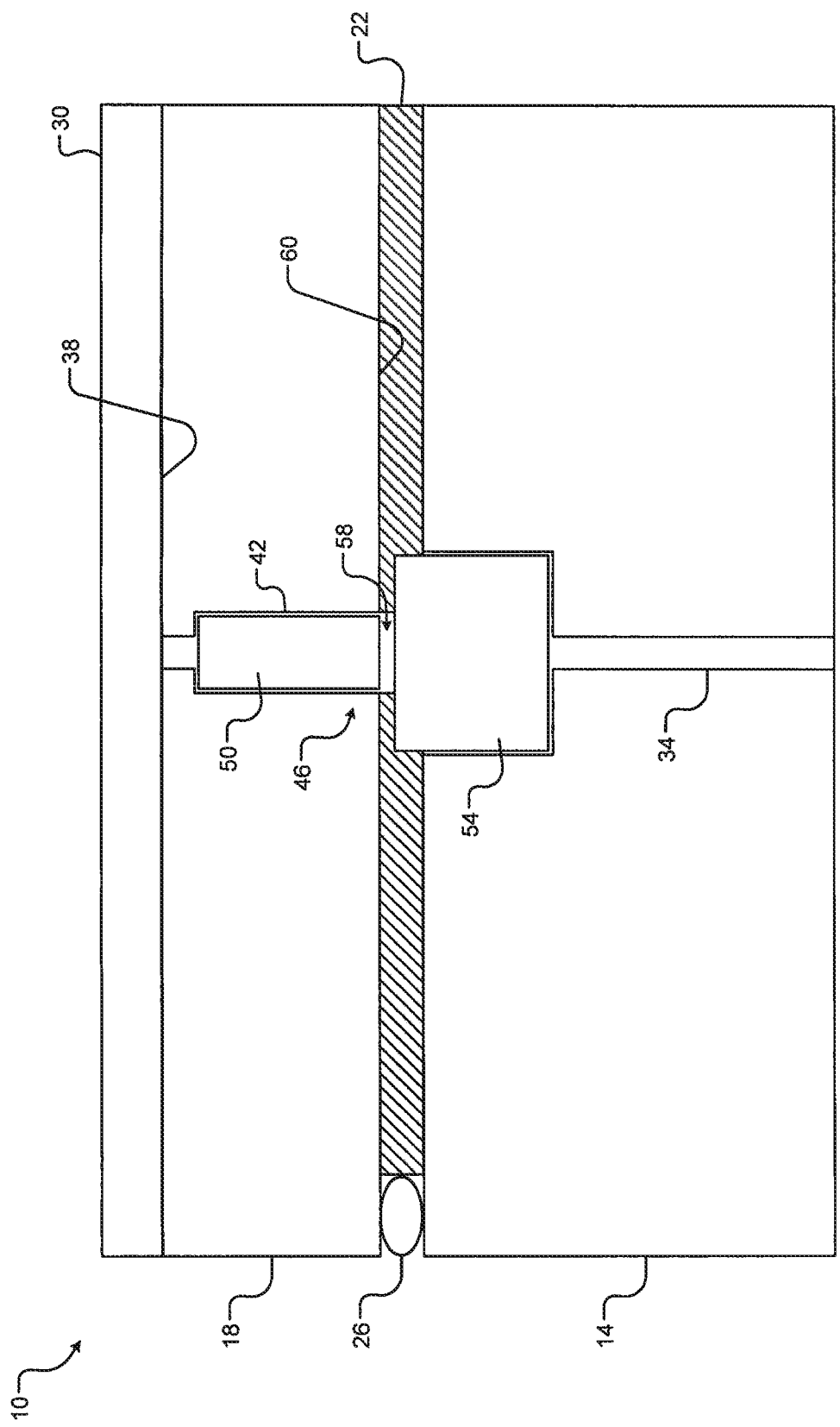
FIG. 1 is an example substrate support including a plug arranged within a heat transfer gas channel.

FIG. 1 shows a portion of an example substrate support 10 including a baseplate 14 and a ceramic layer 18. A bond layer 22 may be formed between the baseplate 14 and the ceramic layer 18. A protective seal 26 may be provided around a perimeter of the bond layer 22 between the ceramic layer 18 and the baseplate 14. A substrate 30 is arranged on the ceramic layer 18.

One or more channels 34 provide heat transfer gas, such as helium, through the baseplate 14 and the ceramic layer 18 to a backside 38 of the substrate 30. The channel 34 may include a chamber 42 defined between the baseplate 14 and the ceramic layer 18. For example, although it may be desirable to minimize a diameter of the channel 34, manufacturing tolerances and limitations may result in a channel 34 including the chamber 42. Accordingly, a plug 46 may be provided within the chamber 42 to further reduce an empty volume within the chamber 42. For example, the plug 46 may comprise porous ceramic. The plug 46 may include an upper portion 50, a lower portion 54, and a gap 58 between the upper portion 50 and the lower portion 54. The plug 46 may be referred to as a dual porous plug. A bottom surface 60 of the ceramic layer 18 may be ground subsequent to installation of the upper portion 50 of the plug within the ceramic layer 18, increasing a width of the gap 58. For example, the gap 58 may have a width of approximately 300 μm (e.g., between 290 and 310 μm). Providing the plug 46 may reduce arcing within the chamber 42 and between the baseplate 14 and the ceramic layer 18. Nonetheless, an electric field may still be present in the gap 58 and arcing may occur in the gap 58.

Systems and methods according to the principles of the present disclosure implement a plug that eliminates the gap at an interface between the baseplate and the ceramic layer. For example, the plug includes an upper portion that extends downward from the ceramic layer and into the channel in the baseplate. The plug includes a lower portion arranged in the channel in the baseplate. The lower portion is configured to receive and surround the upper portion of the plug extending into the baseplate.

Figure 2:
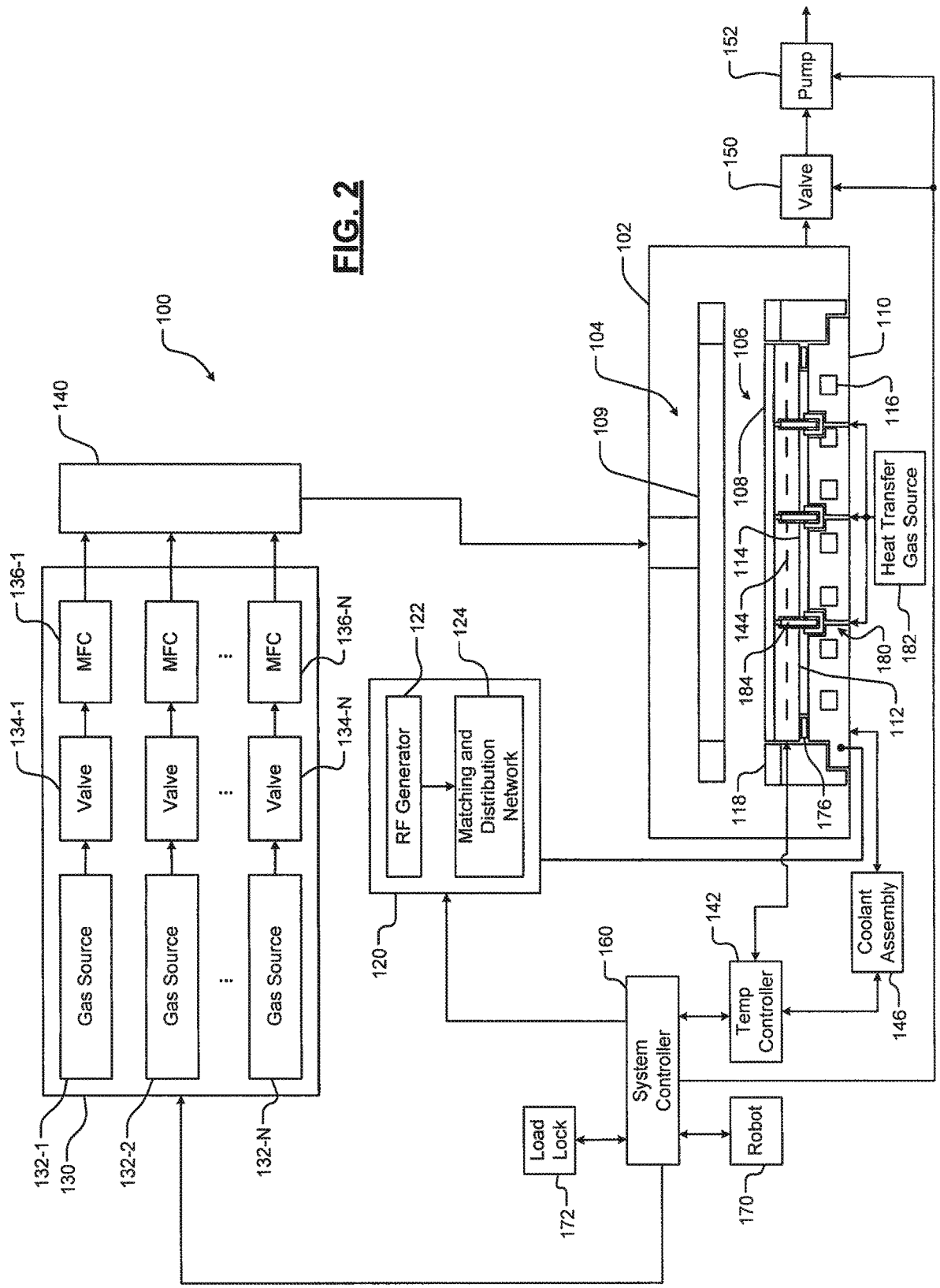
FIG. 2 is a functional block diagram of an example processing chamber.

Referring now to FIG. 2, an example substrate processing system 100 is shown. For example only, the substrate processing system 100 may be used for performing etching using RF plasma and/or other suitable substrate processing. The substrate processing system 100 includes a processing chamber 102 that encloses other components of the substrate processing system 100 and contains the RF plasma. The substrate processing chamber 102 includes an upper electrode 104 and a substrate support 106, such as an electrostatic chuck (ESC). During operation, a substrate 108 is arranged on the substrate support 106. While a specific substrate processing system 100 and chamber 102 are shown as an example, the principles of the present disclosure may be applied to other types of substrate processing systems and chambers, such as a substrate processing system that generates plasma in-situ, that implements remote plasma generation and delivery (e.g., using a plasma tube, a microwave tube), etc.

For example only, the upper electrode 104 may include a gas distribution device such as a showerhead 109 that introduces and distributes process gases. The showerhead 109 may include a stem portion including one end connected to a top surface of the processing chamber. A base portion is generally cylindrical and extends radially outwardly from an opposite end of the stem portion at a location that is spaced from the top surface of the processing chamber. A substrate-facing surface or faceplate of the base portion of the showerhead includes a plurality of holes through which process gas or purge gas flows. Alternately, the upper electrode 104 may include a conducting plate and the process gases may be introduced in another manner.

The substrate support 106 includes a conductive baseplate 110 that acts as a lower electrode. The baseplate 110 supports a ceramic layer 112. In some examples, the ceramic layer 112 may comprise a heating layer, such as a ceramic multi-zone heating plate. A thermal resistance layer 114 (e.g., a bond layer) may be arranged between the ceramic layer 112 and the baseplate 110. The baseplate 110 may include one or more coolant channels 116 for flowing coolant through the baseplate 110. The substrate support 106 may include an edge ring 118 arranged to surround an outer perimeter of the substrate 108.

An RF generating system 120 generates and outputs an RF voltage to one of the upper electrode 104 and the lower electrode (e.g., the baseplate 110 of the substrate support 106). The other one of the upper electrode 104 and the baseplate 110 may be DC grounded, AC grounded or floating. For example only, the RF generating system 120 may include an RF voltage generator 122 that generates the RF voltage that is fed by a matching and distribution network 124 to the upper electrode 104 or the baseplate 110. In other examples, the plasma may be generated inductively or remotely. Although, as shown for example purposes, the RF generating system 120 corresponds to a capacitively coupled plasma (CCP) system, the principles of the present disclosure may also be implemented in other suitable systems, such as, for example only transformer coupled plasma (TCP) systems, CCP cathode systems, remote microwave plasma generation and delivery systems, etc.

A gas delivery system 130 includes one or more gas sources 132-1, 132-2, . . . , and 132-N (collectively gas sources 132), where N is an integer greater than zero. The gas sources supply one or more precursors and mixtures thereof. The gas sources may also supply purge gas. Vaporized precursor may also be used. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the processing chamber 102. For example only, the output of the manifold 140 is fed to the showerhead 109.

A temperature controller 142 may be connected to a plurality of heating elements, such as thermal control elements (TCEs) 144 arranged in the ceramic layer 112. For example, the heating elements 144 may include, but are not limited to, macro heating elements corresponding to respective zones in a multi-zone heating plate and/or an array of micro heating elements disposed across multiple zones of a multi-zone heating plate. The temperature controller 142 may be used to control the plurality of heating elements 144 to control a temperature of the substrate support 106 and the substrate 108.

The temperature controller 142 may communicate with a coolant assembly 146 to control coolant flow through the channels 116. For example, the coolant assembly 146 may include a coolant pump and reservoir. The temperature controller 142 operates the coolant assembly 146 to selectively flow the coolant through the channels 116 to cool the substrate support 106.

A valve 150 and pump 152 may be used to evacuate reactants from the processing chamber 102. A system controller 160 may be used to control components of the substrate processing system 100. A robot 170 may be used to deliver substrates onto, and remove substrates from, the substrate support 106. For example, the robot 170 may transfer substrates between the substrate support 106 and a load lock 172. Although shown as separate controllers, the temperature controller 142 may be implemented within the system controller 160. In some examples, a protective seal 176 may be provided around a perimeter of the bond layer 114 between the ceramic layer 112 and the baseplate 110.

The substrate support 106 includes a plurality of channels 180 arranged to provide a heat transfer gas such as helium from a heat transfer gas source 182 to a backside of the substrate 108. Although shown separately, the heat transfer gas source 182 may be implemented within the gas delivery system 130. The channels 180 include plugs 184 according to the principles of the present disclosure as described below in more detail.

Figure 3:
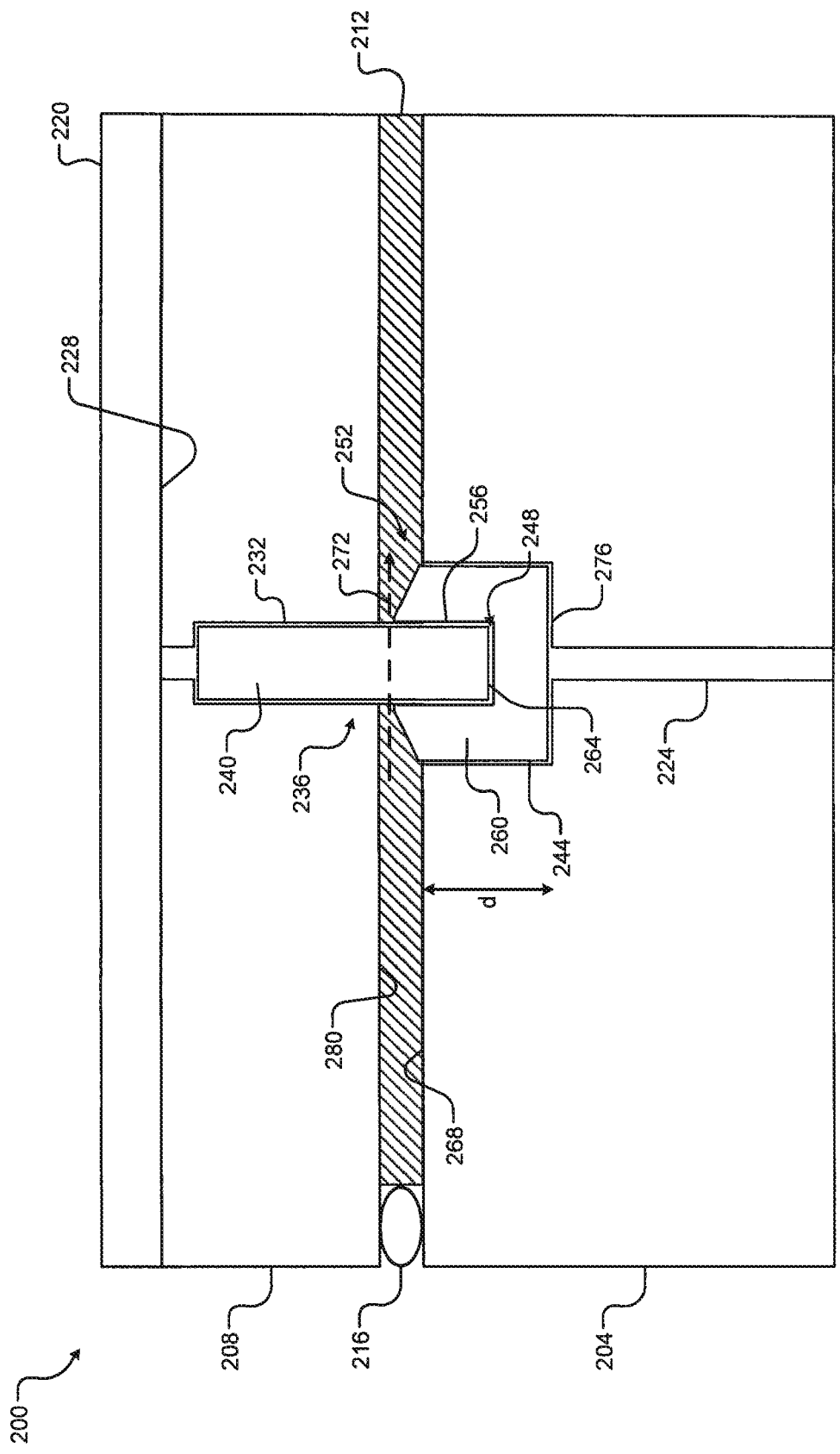
FIG. 3 is an example substrate support including a first example plug according to the present disclosure arranged within a heat transfer gas channel.

Referring now to FIG. 3, an example substrate support 200 according to the principles of the present disclosure includes a baseplate 204 and a ceramic layer 208. A bond layer 212 may be formed between the baseplate 204 and the ceramic layer 208. A protective seal 216 may be provided around a perimeter of the bond layer 212 between the ceramic layer 208 and the baseplate 204. A substrate 220 is arranged on the ceramic layer 208.

One or more channels 224 provide heat transfer gas, such as helium, through the baseplate 204 and the ceramic layer 208 to a backside 228 of the substrate 220. The channel 224 may include a chamber 232 defined between the baseplate 204 and the ceramic layer 208. A plug 236 is provided to occupy space within the chamber 232 (i.e., to reduce an empty volume within the chamber 232). For example, the plug 236 may comprise a dielectric material such as porous ceramic. For example only, the plug 236 may comprise a porous material having an effective dielectric constant $\varepsilon_r$ of approximately 5.3 (e.g., an $\varepsilon_r$ between 4.6 and 6.0). The plug 236 may have a shape complementary to a shape of the chamber 232. For example, the plug 236 may be cylindrical.

The plug 236 may correspond to a dual porous plug including an upper portion 240, a lower portion 244, and a gap 248 between the upper portion 240 and the lower portion 244. The upper portion 240 extends downward from the ceramic layer 208 and into the baseplate 204, traversing a gap 252 between the ceramic layer 208 and the baseplate 204. For example, the lower portion 244 of the plug 236 includes a pocket 256 configured to receive the upper portion 240. Sidewalls 260 of the lower portion 244 surround a bottom end 264 of the upper portion 240. The sidewalls 260 may extend above an upper surface 268 of the baseplate 204 into the gap 252.

Accordingly, the lower portion 244 overlaps the upper portion 240 and the gap 248 between the upper portion 240 and the lower portion 244 is moved downward relative to the gap 252. In other words, the gap 248 is located within the baseplate 204 below the upper surface 268 of the baseplate 204 rather than being located within and/or aligned with the gap 252, and a path across the channel 224 within the gap as indicated by arrow 272 is interrupted. As shown, the upper portion 240 extends into the baseplate 204 at least half of a depth d between the upper surface 268 and a bottom 276 of the chamber 232. The lower portion 244 may extend above the upper surface 268.

A bottom surface 280 of the ceramic layer 208 may be ground prior to installing the upper portion 240 within the ceramic layer 208. Accordingly, grinding the bottom surface 280 does not reduce a length of the upper portion 240 and the gap 248 is minimized. For example, the gap 248 may have a width of 250 µm. For example only, the gap 248 has a width of 240 to 260 µm. Moving the gap 248 downward relative to the gap 252 and reducing the width of the gap 248 according to the principles of the present disclosure reduces an electric field in the gap 248. Accordingly, arcing within the gap 248 may be reduced. In some examples, the upper portion 240 and/or the lower portion 244 may be spray-coated with a dielectric material (e.g., ceramic) to further reduce the width of the gap 248.

Figure 4:
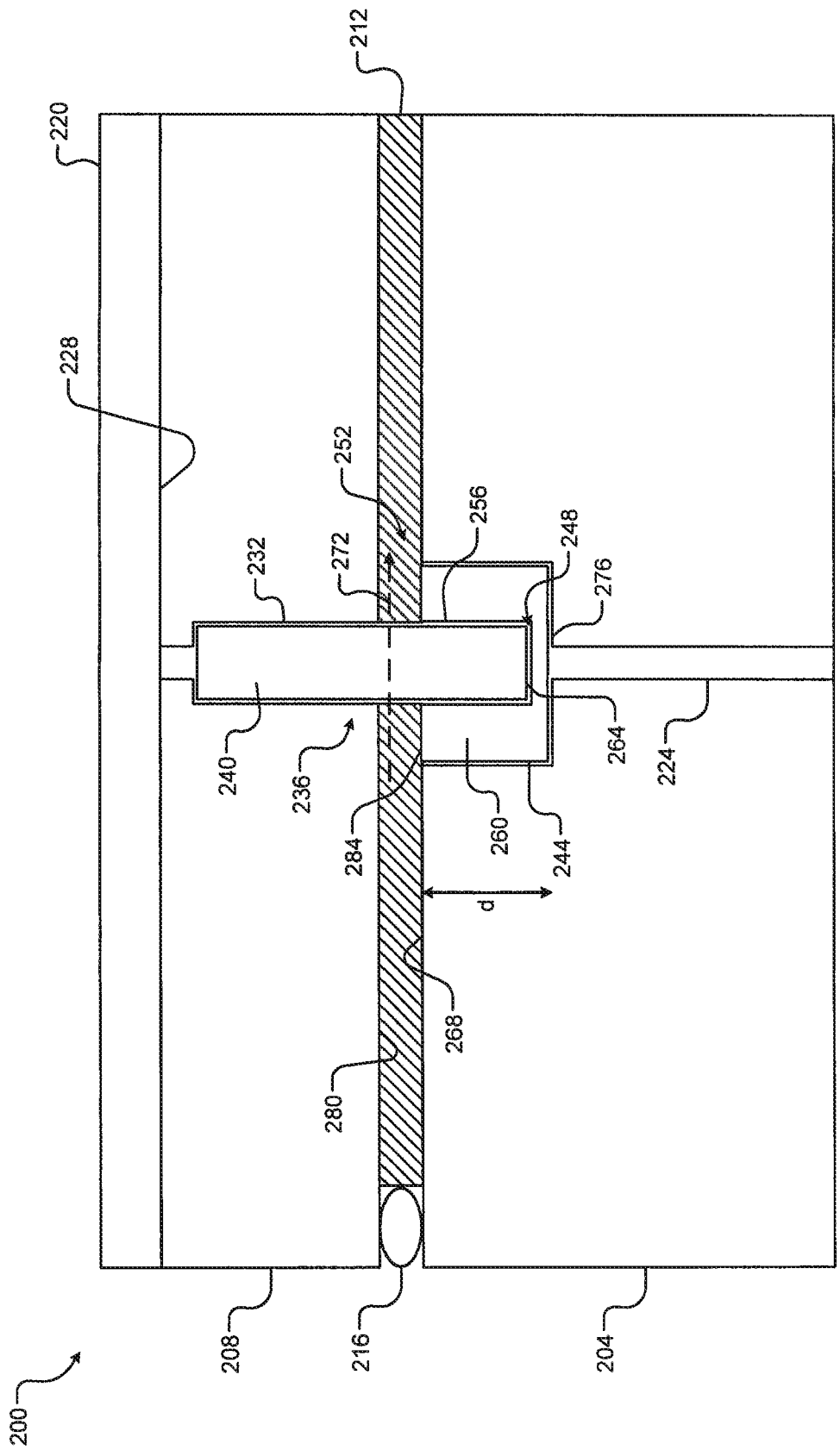
FIG. 4 is an example substrate support including a second example plug according to the present disclosure arranged within a heat transfer gas channel.

FIG. 4 shows another example of the substrate support 200. In this example, the upper portion 240 extends further downward beyond the upper surface 268 into the baseplate 204 and the lower portion 244 relative to the upper portion 240 shown in FIG. 3. For example, the upper portion 240 extends into the baseplate 204 at least 75% of the depth d between the upper surface 268 and the bottom 276 of the chamber 232. Accordingly, an amount of the upper portion 240 overlapped by the sidewalls 260 of the lower portion 244 is increased relative to the example shown in FIG. 3, and the gap 248 is moved further downward toward the bottom 276 of the chamber 232. An upper surface 284 of the lower portion 244 may be approximately coplanar (i.e., flush) with the upper surface 268 of the baseplate 204.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A substrate support, comprising:
a baseplate;
a ceramic layer arranged on the baseplate;
a bond layer arranged in a first gap between the baseplate and the ceramic layer;
a channel formed through the baseplate, the bond layer, and the ceramic layer; and
a plug arranged in the channel, the plug comprising
a lower portion arranged in the baseplate, wherein the lower portion includes a pocket and sidewalls surrounding the pocket; and
an upper portion arranged in the ceramic layer, wherein (i) the upper portion extends below the ceramic layer and the first gap into the pocket, (ii) the sidewalls of the lower portion overlap the upper portion such that a bottom end of the upper portion is enclosed within the pocket of the lower portion, and (iii) a second gap between the upper portion and the lower portion is located within the pocket of the lower portion below the first gap,
wherein at least one of
(i) the sidewalls of the lower portion extend above an upper surface of the baseplate and into the first gap, and
(ii) an upper surface of the lower portion is approximately coplanar with an upper surface of the baseplate.

2. The substrate support of claim 1, wherein the plug comprises porous ceramic.

3. The substrate support of claim 1, wherein the channel includes a chamber, and wherein a width of the chamber is greater than a width of the channel.

4. The substrate support of claim 3, wherein the upper portion extends a first distance below an upper surface of the baseplate, wherein the first distance corresponds to at least half of a depth between the upper surface of the baseplate and a bottom of the chamber.

5. The substrate support of claim 4, wherein the first distance corresponds to at least 75% of the depth between the upper surface of the baseplate and the bottom of the chamber.

6. The substrate support of claim 1, wherein a width of the second gap is less than 260 µm.

7. The substrate support of claim 1, wherein the channel is in fluid communication with a heat transfer gas source.

8. A system comprising the substrate support of claim 7 and further comprising the heat transfer gas source, wherein the heat transfer gas source contains helium.

9. The system of claim 8, further comprising a controller that selectively controls the heat transfer gas source to provide the helium to a backside of a substrate arranged on the ceramic layer via the channel.

10. The substrate support of claim 1, further comprising a plurality of the channels and a plurality of the plugs arranged in respective ones of the plurality of the channels.

11. A substrate processing system, comprising:
a substrate support;
a heat transfer gas source; and
a controller,
wherein the substrate support includes
   a baseplate,
   a ceramic layer arranged on the baseplate,
   a bond layer arranged in a first gap between the baseplate and the ceramic layer,
   a plurality of channels formed through the baseplate, the bond layer, and the ceramic layer, wherein the plurality of channels is in fluid communication with the heat transfer gas source, and
   a plurality of plugs arranged in respective ones of the plurality of channels, each of the plurality of plugs comprising
      a lower portion arranged in the baseplate, wherein the lower portion includes a pocket and sidewalls surrounding the pocket, and
      an upper portion arranged in the ceramic layer, wherein (i) the upper portion extends below the ceramic layer and the first gap into the pocket, (ii) the sidewalls of the lower portion overlap the upper portion such that a bottom end of the upper portion is enclosed within the pocket of the lower portion, and (iii) a second gap between the upper portion and the lower portion is located within the pocket of the lower portion below the first gap,
wherein the controller selectively controls the heat transfer gas source to provide a heat transfer gas to a backside of a substrate arranged on the ceramic layer via the plurality of channels, and
wherein at least one of
   (i) the sidewalls of the lower portion extend above an upper surface of the baseplate and into the first gap, and
   (ii) an upper surface of the lower portion is approximately coplanar with an upper surface of the baseplate.

12. The substrate processing system of claim 11, wherein the plugs comprise porous ceramic.

13. The substrate processing system of claim 11, wherein each of the plurality of channels includes a respective one of a plurality of chambers, and wherein a respective width of each of the chambers is greater than widths of the channels.

14. The substrate processing system of claim 13, wherein the upper portion extends a first distance below an upper surface of the baseplate, wherein the first distance corresponds to at least half of a depth between the upper surface of the baseplate and a bottom of a respective one of the chambers.

15. The substrate processing system of claim 14, wherein the first distance corresponds to at least 75% of the depth between the upper surface of the baseplate and the bottom of the respective one of the chambers.

16. The substrate processing system of claim 11, wherein a width of the second gap is less than 260 µm.

* * * * *